United States Patent
Choi

(10) Patent No.: US 12,034,457 B2
(45) Date of Patent: Jul. 9, 2024

(54) MEMORY, MEMORY MODULE, MEMORY SYSTEM, AND OPERATION METHOD OF MEMORY SYSTEM

(71) Applicant: SK hynix Inc., Gyeonggi-do (KR)

(72) Inventor: Seok Woo Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/986,968

(22) Filed: Nov. 15, 2022

(65) Prior Publication Data

US 2024/0022263 A1    Jan. 18, 2024

(30) Foreign Application Priority Data

Jul. 15, 2022 (KR) .................. 10-2022-0087315

(51) Int. Cl.
*H03M 13/00* (2006.01)
*H03M 13/11* (2006.01)

(52) U.S. Cl.
CPC ...... *H03M 13/1191* (2013.01); *H03M 13/611* (2013.01)

(58) Field of Classification Search
CPC .......... H03M 13/1191; H03M 13/611; H03M 13/6325; H03M 13/6331; H03M 13/6306; H03M 13/63
See application file for complete search history.

(56) References Cited

U.S. PATENT DOCUMENTS

| | | | | |
|---|---|---|---|---|
| 9,189,329 | B1* | 11/2015 | Zhu | G06F 11/1048 |
| 10,198,310 | B1* | 2/2019 | Zhu | G06F 11/1008 |
| 10,546,640 | B2* | 1/2020 | Wu | G06F 11/1068 |
| 10,846,169 | B2* | 11/2020 | Cha | G11C 29/52 |
| 10,846,421 | B2* | 11/2020 | Patange | G06F 21/604 |
| 10,880,193 | B2* | 12/2020 | Yoshida | H04B 10/616 |
| 11,169,874 | B2* | 11/2021 | Shin | H03M 13/1105 |
| 11,200,114 | B2* | 12/2021 | Chen | G06F 11/1032 |
| 11,605,441 | B1* | 3/2023 | Cho | G11C 11/4087 |
| 2019/0042358 | A1 | 2/2019 | Criss et al. | |
| 2021/0183462 | A1 | 6/2021 | Takahashi et al. | |

* cited by examiner

*Primary Examiner* — Esaw T Abraham
(74) *Attorney, Agent, or Firm* — IP&T GROUP LLP

(57) ABSTRACT

A memory system may include an error correction code generation circuit configured to generate a first error correction code having a large bit number by using write data and a first H matrix in a first error correction mode, and to generate a second error correction code having a small bit number by using the write data and a second H matrix in a second error correction mode, and a memory core configured to store the first error correction code and the write data in the first error correction mode, and to store the second error correction code and the write data in the second error correction mode.

8 Claims, 10 Drawing Sheets

MEMORY, MEMORY MODULE, MEMORY SYSTEM, AND OPERATION METHOD OF MEMORY SYSTEM

CROSS-REFERENCE TO RELATED APPLICATION

This application claims priority under 35 U.S.C. § 119 to Korean Patent Application No. 10-2022-0087315 filed on Jul. 15, 2022, which is incorporated herein by reference in its entirety.

BACKGROUND

1. Field

Embodiments of the present disclosure relate to a memory system.

2. Discussion of the Related Art

In the early days of a semiconductor memory industry, a plurality of original good dies having no failed memory cell in a memory having passed through a semiconductor manufacturing process were distributed on a wafer. However, as the capacity of memory gradually increases, it has been difficult to manufacture a memory having no failed memory cell, and at the present time, it is safe to say that such a memory is no longer manufactural. As one measure of overcoming such a situation, a method of repairing failed memory cells of a memory with redundancy memory cells is being used.

As another measure, a memory system uses an error correction circuit (ECC circuit) for correcting an error and corrects an error occurring in a memory cell and an error occurring while data is transmitted during read and write processes of the memory system.

SUMMARY

Various embodiments of the present disclosure are directed to providing a technique for improving the efficiency of error correction in a memory system.

A memory system in accordance with an embodiment of the present disclosure may include: an error correction code generation circuit configured to generate a first error correction code having a large bit number by using write data and a first H matrix in a first error correction mode, and to generate a second error correction code having a small bit number by using the write data and a second H matrix in a second error correction mode; and a memory core configured to store the first error correction code and the write data in the first error correction mode, and to store the second error correction code and the write data in the second error correction mode.

A memory in accordance with another embodiment of the present disclosure may include: a first parity generation circuit configured to generate a first parity by using write data in respective first and second error correction modes; a second parity generation circuit configured to generate a second parity by using the write data in the first error correction mode; a first cell array configured to store the write data; a second cell array configured to store the first parity; and a third cell array configured to store the second parity.

A memory module in accordance with further another embodiment of the present disclosure may include: a module controller including: a first parity generation circuit configured to generate a first parity by using write data in respective first and second error correction modes; and a second parity generation circuit configured to generate a second parity by using the write data in the first error correction mode; one or more first memories configured to store the write data; one or more second memories configured to store the first parity; and one or more third memories configured to store the second parity.

A memory system in accordance with still another embodiment of the present disclosure may include: a memory controller including: a first parity generation circuit configured to generate a first parity by using write data in respective first and second error correction modes; and a second parity generation circuit configured to generate a second parity by using the write data in the first error correction mode; one or more first memories configured to store the write data; one or more second memories configured to store the first parity; and one or more third memories configured to store the second parity.

An operation method of a memory system in accordance with yet another embodiment of the present disclosure may include: generating a first parity and a second parity corresponding to write data by using the write data to store the write data, the first parity, and the second parity in memory cells selected from a memory core by a write address during a write operation in a first error correction mode; reading data and the first parity from memory cells selected from the memory core by a read address to correct an error in the read data by using the read first parity during a read operation in a second error correction mode.

An error correcting code (ECC) circuit in accordance with still yet another embodiment of the present disclosure may include: default and additional ECC generating circuits respectively configured to generate, based on default and additional H matrixes, default and additional ECCs for data to be stored in a storage medium; default and additional syndrome generating circuits respectively configured to generate, based on the default and additional ECCs and the default and additional H matrixes, default and additional syndromes for the data read from the storage medium; a default error correcting circuit configured to error-correct, on a bit basis, the read data according to the default syndrome; and an enhanced error correcting circuit configured to error-correct, on a symbol basis, the read data according to a combination of the default and additional syndromes, wherein each of the additional ECC generating circuit, the additional syndrome generating circuit and the enhanced error correcting circuit is selectively operable according to a mode signal, and wherein the default H matrix is of a single error correction double error detection (SECDED) code scheme and a combination of the default and additional H matrixes is of a Reed-Solomon (RS) code scheme.

According to embodiments of the present disclosure, the efficiency of error correction in a memory system may be improved.

DETAILED DESCRIPTION

Figure 1:
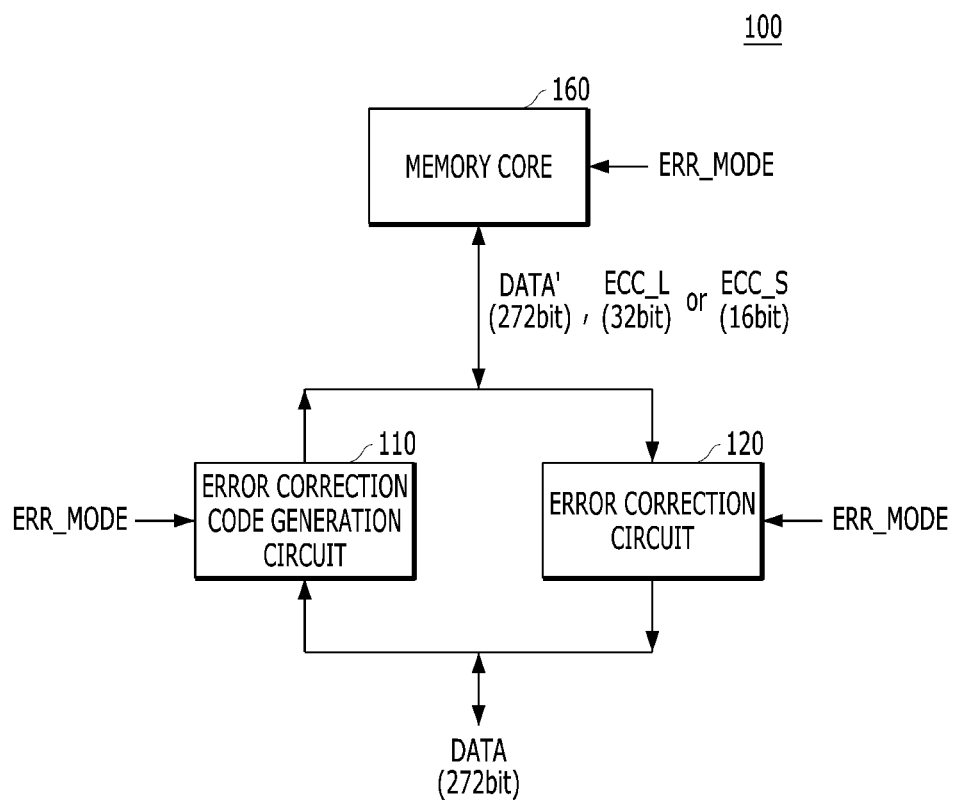
FIG. 1 is a configuration diagram of a memory system 100 in accordance with an embodiment of the present disclosure.

Hereinafter, in order to describe in detail the present disclosure for a person skilled in the art to which the present disclosure pertains to be able to easily carry out the technical idea of the present disclosure, embodiments of the present disclosure will be described with reference to the accompanying drawings. In describing the present disclosure, publicly-known configurations irrelevant to the subject matter of the present disclosure may be omitted. In adding reference numerals to components of each drawing, it should be noted that only the same components are given the same reference numerals if possible even though they are illustrated in different drawings.

FIG. 1 is a configuration diagram of a memory system 100 in accordance with an embodiment of the present disclosure. FIG. 1 illustrates only a portion directly related to data storage and data error correction in the memory system 100.

Referring to FIG. 1, the memory system 100 may include an error correction code generation circuit 110, an error correction circuit 120, and a memory core 160.

An error correction mode of the memory system 100 may include a first error correction mode and a second error correction mode. The first error correction mode may be a mode having a relatively high error correction capability using a first error correction code ECC_L that is an error correction code having a large bit number (for example, 32 bits). For example, the first error correction mode may have an ability capable of correcting an error in units of symbols (for example, in units of 16 bits) occurring in data DATA' (illustrated as 272 bits) read from the memory core 160. An example of such a first error correction code ECC_L may include a Reed-Solomon (RS) code. The second error correction mode may be a mode having a relatively low error correction capability using a second error correction code ECC_S that is an error correction code having a small number of bits (for example, 16 bits). For example, the second error correction mode may have an ability capable of correcting an error in units of bits occurring in the data DATA' read from the memory core 160. An example of such a second error correction code ECC_S may include a single error correction double error detection (SECDED) code. When the SECDED code is used, even a 1-bit error may be corrected and even a 2-bit error may be detected. An error correction mode signal ERR_MODE may be a signal that is activated in the first error correction mode and deactivated in the second error correction mode.

The error correction code generation circuit 110 may generate an error correction code by using data DATA during a write operation of the memory system 100. The error correction code generation circuit 110 may generate the first error correction code ECC_L having a large bit number in the first error correction mode in which the error correction mode signal ERR_MODE is activated. The error correction code generation circuit 110 may generate the second error correction code ECC_S having a small number of bits in the second error correction mode in which the error correction mode signal ERR_MODE is deactivated. During the write operation, since the error correction code is merely generated but no error correction operation is performed, the data DATA inputted to the error correction code generation circuit 110 and the data DATA' outputted from the error correction code generation circuit 110 may be substantially identical to each other.

The error correction circuit 120 may correct an error in the data DATA' by using an error correction code read from the memory core 160 during a read operation of the memory system 100. In the first error correction mode in which the error correction mode signal ERR_MODE is activated, the error correction circuit 120 may correct an error in the data DATA' by using the first error correction code ECC_L having a large bit number. In the second error correction mode in which the error correction mode signal ERR_MODE is deactivated, the error correction circuit 120 may correct the error in the data DATA' by using the second error correction code ECC_S having a small number of bits. Correcting the error may mean detecting the error in the data DATA' by using the error correction code and correcting the error when the error is detected. In the first error correction mode, since the error correction circuit 120 uses the first error correction code ECC_L having a large bit number, the error correction capability of the error correction circuit 120 may be relatively high, and in the second error correction mode, since the error correction circuit 120 uses the second error correction code ECC_S having a small number of bits, the error correction capability of the error correction circuit 120 may be relatively low.

The memory core 160 may receive and store the data DATA' and the error correction code generated by the error correction code generation circuit 110, during the write operation. During the read operation, the memory core 160 may output the stored data DATA' and error correction code. In the first error correction mode, 272 bits of data DATA' and 32 bits of first error correction code ECC_L may be stored in the memory core 160 for each write operation, and the 272 bits of data DATA' and the 32 bits of first error correction code ECC_L may be read from the memory core 160 for each read operation. In the second error correction mode, the 272 bits of data DATA' and 16 bits of second error correction code ECC_S may be stored in the memory core 160 for each write operation, and the 272 bits of data DATA' and the 16 bits of second error correction code ECC_S may be read from the memory core 160 for each read operation. That is, in the first error correction mode, 304 bits of information may be accessed from the memory core 160 during one-time read operation and one-time write operation, and in the second error correction mode, 288 bits of information may be accessed from the memory core 160 during a one-time read operation and a one-time write operation. In the second error correction mode, since the memory core 160 is less used than in the first error correction mode, a part of the memory core 160 may be deactivated.

The memory core 160 refers to a place where data is stored in the memory system 100. In the memory system 100, data may also be stored in one memory, but may also be distributed and stored in a plurality of memories. Accordingly, the memory core 160 may also refer to a place where data is stored in one memory or a place where data is stored in a plurality of memories. That is, the memory core 160 in FIG. 1 may also be distributed and exist in a plurality of memories.

The error correction code generation circuit 110 may be provided anywhere on a path through which data is transmitted during the write operation in the memory system 100. During the write operation, a memory controller transmits, to memory cells of the memory, write data received from a host, and the error correction code generation circuit 110 may be located anywhere on the path through which the write data is transmitted. For example, the error correction code generation circuit 110 may also be provided in the memory controller or may also be provided in the memory.

The error correction circuit 120 may be provided anywhere on a path through which data is transmitted during the read operation in the memory system 100. During the read operation, data read from the memory cells of the memory are transmitted to the host through the memory controller, and the error correction circuit 120 may be located anywhere on the path through which the read data are transmitted. For example, the error correction circuit 120 may also be provided in the memory or may also be provided in the memory controller.

FIG. 1 illustrates an example in which the data DATA is 272 bits, the first error correction code ECC_L is 32 bits, and the second error correction code ECC_S is 16 bits, but it is of course possible that the number of bits of the data DATA and the number of bits of each of the error correction codes ECC_L and ECC_S may be different from the above.

Figure 2:
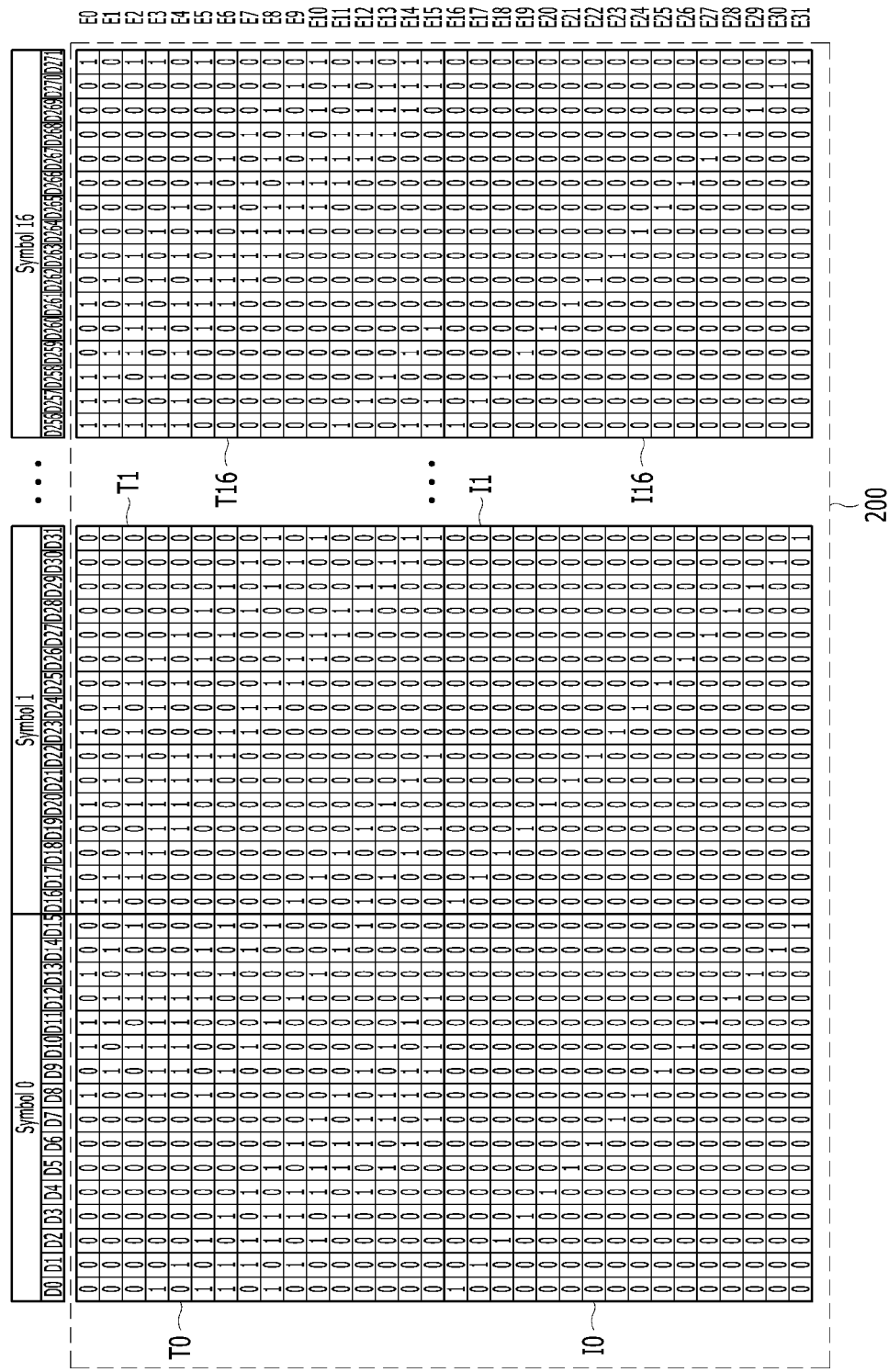
FIG. 2 is a diagram illustrating an example of an H matrix 200 used by an error correction code generation circuit 110 in FIG. 1 in order to generate a first error correction code ECC_L in accordance with an embodiment of the present disclosure.

FIG. 2 illustrates an example of an H matrix 200 used by the error correction code generation circuit 110 in FIG. 1 in order to generate the first error correction code ECC_L in accordance with an embodiment of the present disclosure.

The error correction code generation circuit 110 may generate the first error correction code ECC_L by using the H matrix 200 illustrated in FIG. 2. The H matrix 200 may be configured as a (the number of bits of an error correction code)×(the number of bits of data) matrix. Since FIG. 2 illustrates an example in which the first error correction code ECC_L is 32 bits and the data DATA is 272 bits, the H matrix 200 may be configured as a 32×272 matrix. Each component of the H matrix 200 may have a value of 1 or 0. The H matrix 200 may be divided into 34 16×16 matrices T0 to T16 and I0 to I16. In FIG. 2, symbol 0 Symbol 0 to symbol 16 Symbol 16 may represent symbols obtained by grouping 272 bits D0 to D271 of data DATA in units of 16 bits.

The column vectors of the H matrix 200 may correspond to the bits D0 to D271 of the data DATA, respectively. Referring to FIG. 2, a column vector corresponding to D0 may be '0001011010000000010000000000000000', a column vector corresponding to D1 may be '0000101101000000010000000000000000', and a column vector corresponding to D258 may be '1101000000000100001000000000000000'.

Hereinafter, how to generate the first error correction code ECC_L by using the H matrix 200 will be described. Bits E0 to E31 of the first error correction code ECC_L may be generated by multiplying the bits D0 to D271 of the data DATA by column vectors corresponding to the bits D0 to D271, respectively, and adding the multiplication results in a horizontal direction.

For example, E0 may be generated as D0*0+D1*0+D2*0+D3*0+D4*0+D5*0+D6*0+D7*0+D8*1+D9*0+D10*1+D11*1+D12*0+D13*1+D14*0+D15*0+D16*1+D17*0+D18*0+D19*0+D20*1+D21*0+D22*0+D23*0+D24*0+D25*0+D26*0+D27*0+D28*0+D29*0+D30*0+D31*0+ . . . +D256*1+D257*1+D258*1+D259*0+D260*0+D261*1+D262*0+D263*0+D264*0+D265*0+D266*0+D267*0+D268*0+D269*0+D270*0+D271*1.

E1 may be generated as D0*0+D1*0+D2*0+D3*0+D4*0+D5*0+D6*0+D7*0+D8*0+D9*1+D10*0+D11*1+D12*1+D13*0+D14*1+D15*0+D16*1+D17*1+D18*0+D19*0+D20*0+D21*1+D22*0+D23*0+D24*0+D25*0+D26*0+D27*0+D28*0+D29*0+D30*0+D31*0+ . . . +D256*1+D257*1+D258*1+D259*1+D260*0+D261*0+D262*1+D263*0+D264*0+D265*0+D266*0+D267*0+D268*0+D269*0+D270*0+D271*0.

Similarly, E31 may be generated as D0*0+D1*0+D2*0+D3*0+D4*0+D5*0+D6*0+D7*0+D8*0+D9*0+D10*0+D11*0+D12*0+D13*0+D14*0+D15*1+D16*0+D17*0+D18*0+D19*0+D20*0+D21*0+D22*0+D23*0+D24*0+D25*0+D26*0+D27*0+D28*0+D29*0+D30*0+D31*1+ . . . +D256*0+D257*0+D258*0+D259*0+D260*0+D261*0+D262*0+D263*0+D264*0+D265*0+D266*0+D267*0+D268*0+D269*0+D270*0D271*1.

For reference, in the above equations and in the following description, an addition means an exclusive OR. Accordingly, the result of the addition may be 0 when the number of 1s is even and may be 1 when the number of 1s is odd. For example, 1+1+0+1 may be 1 and 0+1+1+0+1 may be 0.

The error correction code generation circuit 110 generates the first error correction code ECC_L by using the H matrix 200 in the first error correction mode, but needs to generate the second error correction code ECC_S in the second error correction mode. An H matrix is also required for generating the second error correction code ECC_S, and when the H matrix required for generating the second error correction code ECC_S is included in the H matrix 200 required for generating the first error correction code ECC_L, the error correction code generation circuit 110 may be designed more efficiently.

Figure 3:
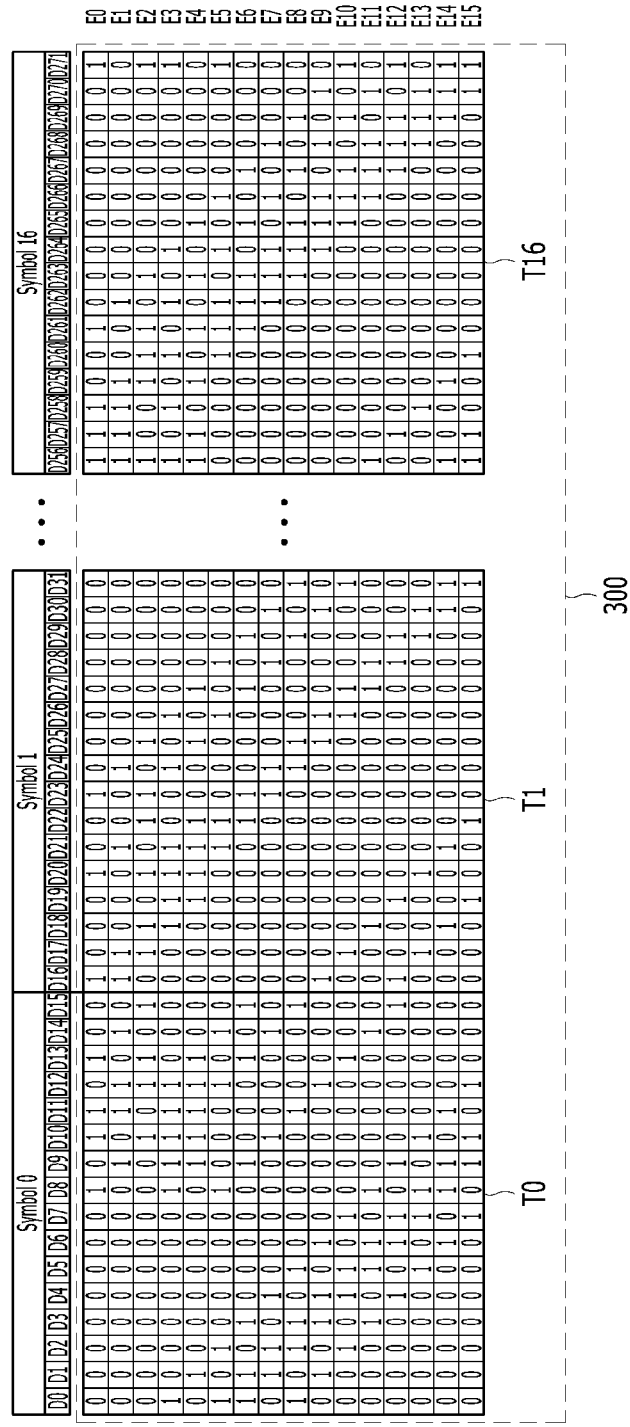
FIG. 3 is a diagram illustrating an example of an H matrix 300 used by the error correction code generation circuit 110 in FIG. 1 in order to generate a second error correction code ECC_S in accordance with an embodiment of the present disclosure.

FIG. 3 illustrates an example of an H matrix 300 used by the error correction code generation circuit 110 in FIG. 1 in order to generate the second error correction code ECC_S in accordance with an embodiment of the present disclosure.

The error correction code generation circuit 110 may generate the second error correction code ECC_S by using the H matrix 300 illustrated in FIG. 3. Since FIG. 3 illustrates an example in which the number of bits of the second error correction code ECC_S is 16, the H matrix 300 may be configured as a 16×272 matrix.

The H matrix 300 may be divided into 17 32×32 matrices T0 to T16, and it can be seen that the matrices T0 to T16 of the H matrix 300 are substantially identical to the matrices T0 to T16 of the H matrix 200 in FIG. 2. That is, it can be seen that the H matrix 300 in FIG. 3 is included in the H matrix 200 in FIG. 2.

Since the matrices T0 to T16 for generating the bits E0 to E15 of the first error correction code ECC_L in the H matrix 300 in FIG. 3 are substantially identical to those in the H matrix 200 in FIG. 2, the bits E0 to E15 of the second error correction code ECC_S may be generated to be substantially identical to the bits of the first error correction code ECC_L.

Figure 4:
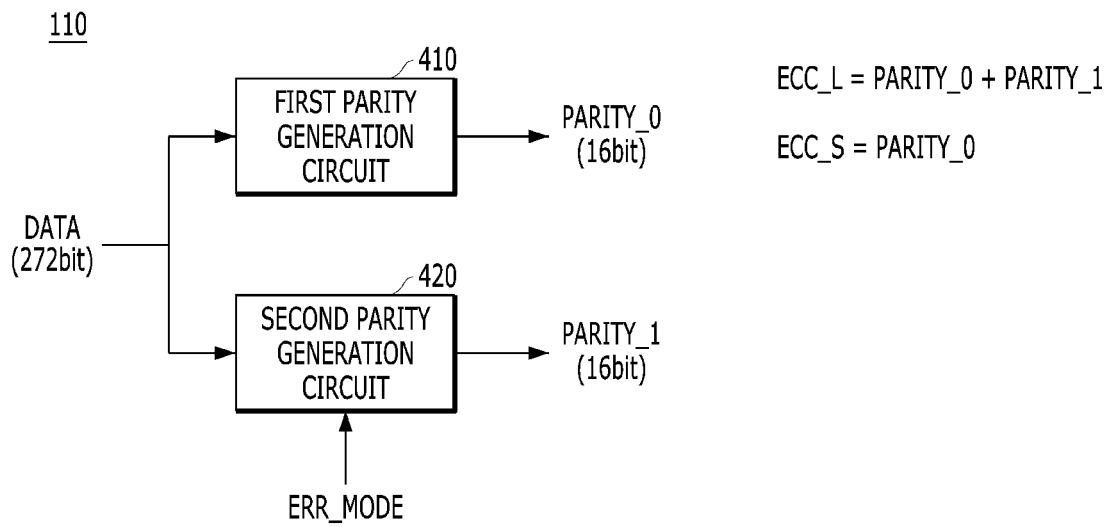
FIG. 4 is a configuration diagram of the error correction code generation circuit 110 in FIG. 1 in accordance with an embodiment of the present disclosure.

FIG. 4 is a configuration diagram of the error correction code generation circuit 110 in FIG. 1 in accordance with an embodiment of the present disclosure.

Referring to FIG. 4, the error correction code generation circuit 110 may include a first parity generation circuit 410 and a second parity generation circuit 420.

The first parity generation circuit 410 may be activated in the first error correction mode and the second error correction mode, and may generate a first parity PARITY_0 by using the data DATA. As described above, the first parity PARITY_0 may be codes generated using the data DATA and the matrices T0 to T16 (=300), that is, E0 to E15 in FIG. 2 and FIG. 3. Since the matrices T0 to T16 (=300) are used to generate the first parity PARITY_0, the 16×272 matrix 300 (=T0 to T16) used by the first parity generation circuit 410 in order to generate the first parity will be referred to as a first parity matrix.

The second parity generation circuit 420 may be activated in the first error correction mode in which the error correction mode signal ERR_MODE is activated, and may generate a second parity PARITY_1 by using the data DATA. As described above, the second parity PARITY_1 may be codes generated using the data DATA and the matrices I0 to I16, that is, E16 to E31 in FIG. 2. Since the matrices I0 to I16 are used to generate the second parity PARITY_1, the 16×272 matrix (I0 to I16) used by the second parity generation circuit 420 in order to generate the second parity will be referred to as a second parity matrix. In the second error correction mode in which the error correction mode signal ERR_MODE is deactivated, the second parity generation circuit 420 may be deactivated.

The first error correction code ECC_L may be a code including the first parity PARITY_0 and the second parity PARITY_1, and the second error correction code ECC_S may be a code including the first parity PARITY_0.

Since the H matrix 300 for generating the second error correction code is included in the H matrix 200 for generating the first error correction code, the first parity generation circuit 410 may be used to generate the first error correction code ECC_L and the second error correction code ECC_S, and as a result, the area of the error correction code generation circuit 110 may be reduced.

Figure 5:
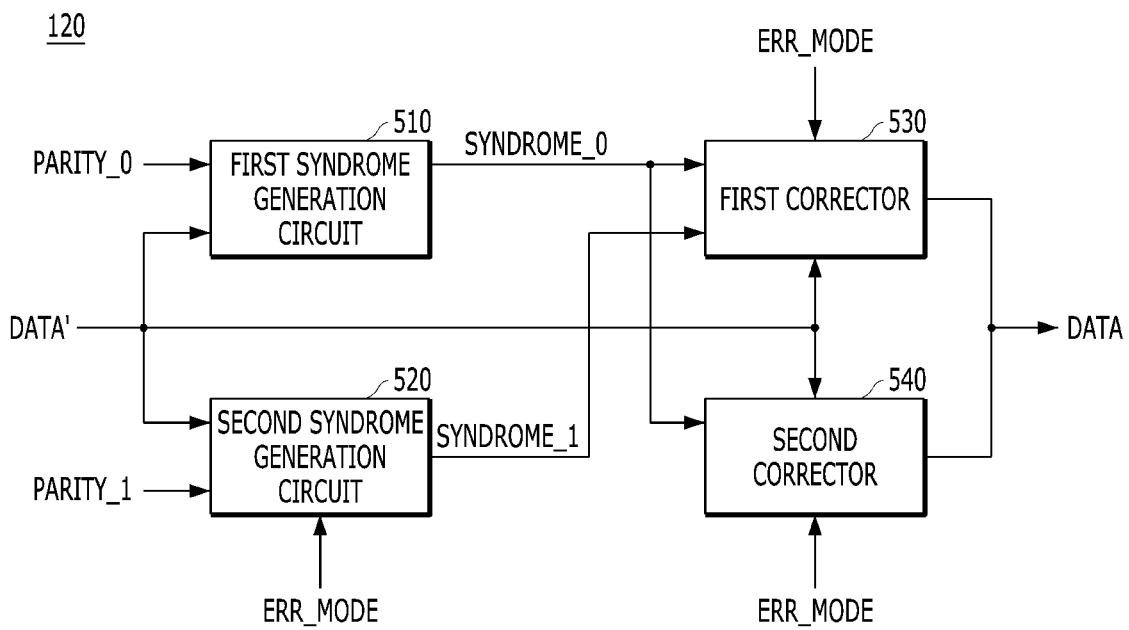
FIG. 5 is a configuration diagram of the error correction circuit 120 in FIG. 1 in accordance with an embodiment of the present disclosure.

FIG. 5 is a configuration diagram of the error correction circuit 120 in FIG. 1 in accordance with an embodiment of the present disclosure.

Referring to FIG. 5, the error correction circuit 120 may include a first syndrome generation circuit 510, a second syndrome generation circuit 520, a first corrector 530, and a second corrector 540.

The first syndrome generation circuit 510 may generate a first syndrome SYNDROME_0 by using the data DATA' read from the memory core 160 in the first error correction mode and the second error correction mode and the first parity PARITY_0. The first syndrome generation circuit 510 may use the first parity matrix (T0 to T16) to generate the first syndrome SYNDOME_0.

Figure 6:
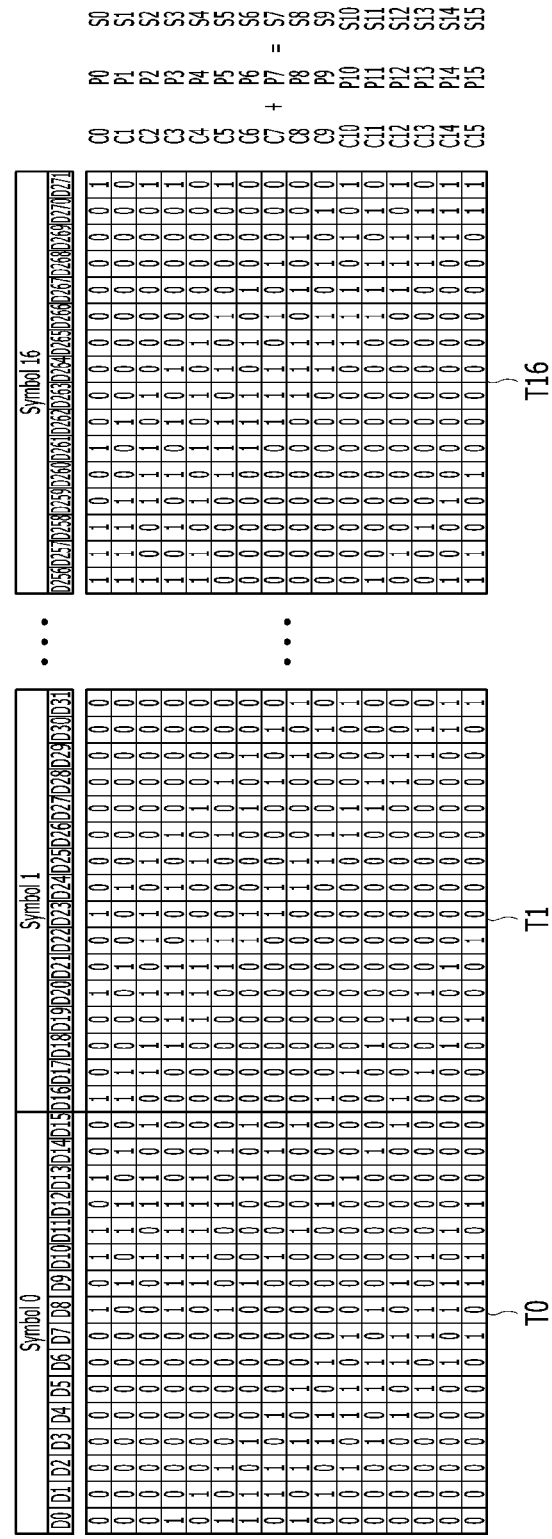
FIG. 6 is a diagram illustrating a process in which a first syndrome generation circuit 510 generates a first syndrome SYNDROME_0 by using a first parity matrix (T0 to T16) in accordance with an embodiment of the present disclosure.

FIG. 6 illustrates a process in which the first syndrome generation circuit 510 generates the first syndrome SYNDROME_0 by using the first parity matrix (T0 to T16) in accordance with an embodiment of the present disclosure. First, bits C0 to C15 may be generated by multiplying the bits D0 to D271 of the data DATA' read from the memory core 160 with corresponding column vectors in the first parity matrix (T0 to T16), respectively, and adding the multiplication results in the horizontal direction. Then, bits S0 to S15 of the first syndrome SYNDROME_0 may be generated by adding, to the bits C0 to C15, bits P0 to P15 of the first parity PARITY_0 read from the memory core 160.

For example, S0 may be generated as D0*0+D1*0+ D2*0+D3*0+D4*0+D5*0+D6*0+D7*0+D8*0+D9*0+ D10*1+D11*1+D12*0+D13*1+D14*0+D15*0+D16*1+ D17*0+D18*0+D19*0+D20*1+D21*0+D22*0+D23*1+ D24*0+D25*0+D26*0+D27*0+D28*0+D29*0+D30*0+ D31*0+ . . . +D256*1+D257*1+D258*1+D259*0+ D260*0+D261*1+D262*0+D263*0+D264*0+D265*0+ D266*0+D267*0+D268*0+D269*0+270*0+D271*1+P0.

S1 may be generated as D0*0+D1*0+D2*0+D3*0+ D4*0+D5*0+D6*0+D7*0+D8*0+D9*1+D10*0+D11*1+ D12*1+D13*0+D14*1+D15*0+D16*1+D17*1+D18*0+ D19*0+D20*0+D21*1+D22*0+D23*0+D24*0+ D25*0+D26*0+D27*0+D28*0+D29*0+D30*0+D31* 0+ . . . +D256*1+D257*1+D258*1+D259*1+D260*0+ D261*0+D262*1+D263*0+D264*0+D265*0+D266*0+ D267*0+D268*0+D269*0+D270*0+D271*0+P1.

Similarly, S15 may be generated as D0*0+D1*0+D2*0+ D3*0+D4*0+D5*0+D6*0+D7*1+D8*0+D9*1+D10*1+ D11*0+D12*1+D13*0+D14*0+D15*0+D16*0+D17*0+ D18*0+D19*1+D20*0+D21*0+D22*1+D23*0+D24*0+ D25*0+D26*0+D27*0+D28*0+D29*0+D30*0+D31* 1+ . . . +D256*1+D257*1+D258*0+D259*0+D260*1+ D261*0+D262*0+D263*0+D264*0+D265*0+D266*0+ D267*0+D268*0+D269*0+D270*1+D271*1+P15.

Referring back to FIG. 5, the second syndrome generation circuit 520 may be activated in the first error correction mode in which the error correction mode signal ERR_MODE is activated, and may generate the second syndrome SYNDROME_1 by using the read data DATA' and the second parity PARITY_1. The second syndrome generation circuit 520 may use the second parity matrix (I0 to I16) to generate the second syndrome SYNDROME_1. In the second error correction mode in which the error correction mode signal ERR_MODE is deactivated, the second syndrome generation circuit 520 may be deactivated.

Figure 7:
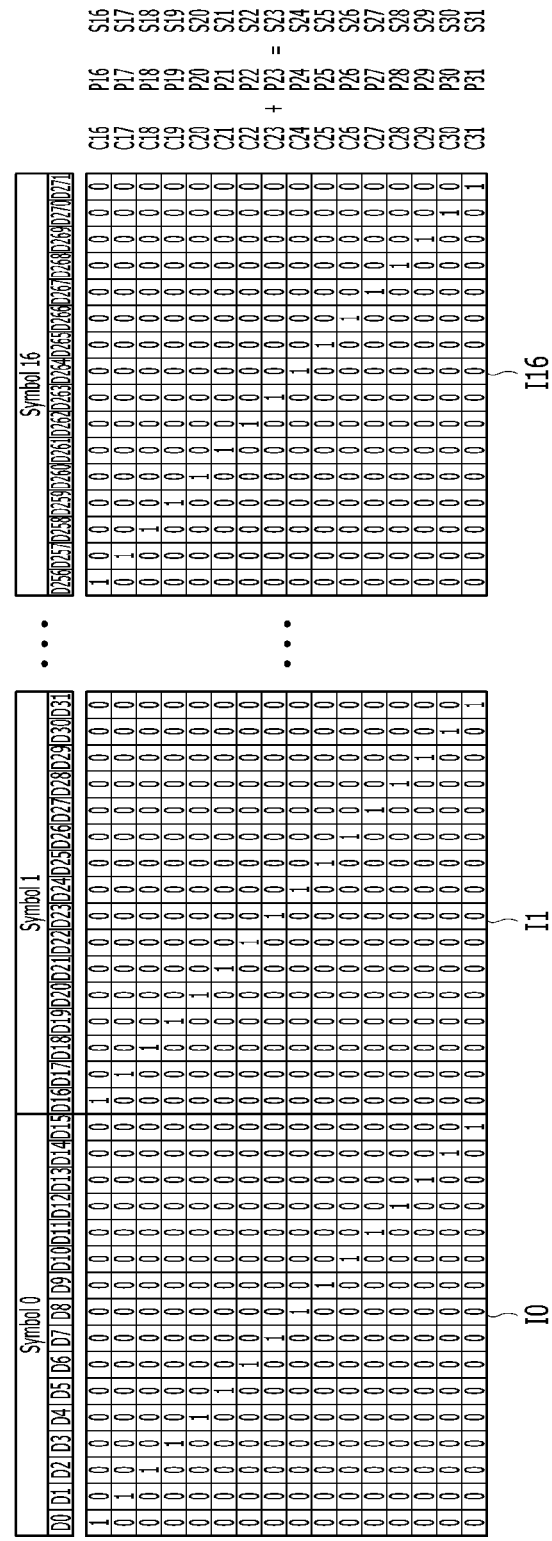
FIG. 7 is a diagram illustrating a process in which a second syndrome generation circuit 520 generates a second syndrome SYNDROME_1 by using a second parity matrix (I0 to I16) in accordance with an embodiment of the present disclosure.

FIG. 7 illustrates a process in which the second syndrome generation circuit 520 generates the second syndrome SYNDROME_1 by using the second parity matrix (I0 to I16). First, bits C16 to C31 may be generated by multiplying the bits D0 to D271 of the data DATA' read from the memory core 160 with corresponding column vectors in the second parity matrix I0 to I16, respectively, and adding the multiplication results in the horizontal direction. Then, bits S16 to S31 of the second syndrome SYNDROME_1 may be generated by adding, to the bits C16 to C31, bits P16 to P31 of the second parity PARITY_1 read from the memory core 160.

For example, S16 may be generated as D0*1+D1*0+ D2*0+D3*0+D4*0+D5*0+D6*0+D7*0+D8*0+D9*0+ D10*0+D11*0+D12*0+D13*0+D14*0+D15*0+D16*1+ D17*0+D18*0+D19*0+D20*0+D21*0+D22*0+D23*0+ D24*0+D25*0+D26*0+D27*0+D28*0+D29*0+D30*0+ D31*0+ . . . +D256*1+D257*0+D258*0+D259*0+ D260*0+D261*0+D262*0+D263*0+D264*0+D265*0+ D266*0+D267*0+D268*0+D269*0+D270*0+D271*0+ P16.

S17 may be generated as D0*0+D1*1+D2*0+D3*0+ D4*0+D5*0+D6*0+D7*0+D8*0+D9*0+D10*0+D11*0+ D12*0+D13*0+D14*0+D15*0+D16*0+D17*1+D18*0+ D19*0+D20*0+D21*0+D22*0+D23*0+D24*0+ D25*0+D26*0+D27*0+D28*0+D29*0+D30*0+D31* 0+ . . . +D256*0+D257*1+D258*0+D259*0+D260*0+ D261*0+D262*0+D263*0+D264*0+D265*0+D266*0+ D267*0+D268*0+D269*0+D270*0+D271*0+P17.

Similarly, S31 may be generated as D0*0+D1*0+D2*0+ D3*0+D4*0+D5*0+D6*0+D7*0+D8*0+D9*0+D10*0+ D11*0+D12*0+D13*0+D14*0+D15*1+D16*0+D17*0+ D18*0+D19*0+D20*0+D21*0+D22*0+D23*0+D24* 0+D25*0+D26*0+D27*0+D28*0+D29*0+D30*0+D31* 1+ . . . +D256*0+D257*0+D258*0+D259*0+D260*0+ D261*0+D262*0+D263*0+D264*0+D265*0+D266*0+ D267*0+D268*0+D269*0+D270*0+D271*1+P31.

Referring back to FIG. 5, the first corrector 530 may be activated in the first error correction mode in which the error correction mode signal ERR_MODE is activated, and may correct the error in the data DATA' by using the first syndrome SYNDROME_0 and the second syndrome SYNDROME_1. The first corrector 530 may have a high error correction capability in units of symbols. For example, regardless of how many errors occur in one symbol among 16 symbols Symbol 0 to Symbol 15 (each symbol is 16 bits) of the data DATA', the first corrector 530 may correct the errors. That is, the first corrector 530 may correct even a 16-bit error occurring within one symbol. The first corrector 530 may be deactivated in the second error correction mode in which the error correction mode signal ERR_MODE is deactivated.

When the values S0 to S31 of the first syndrome SYNDROME_0 and the second syndrome SYNDROME_1 are all '0', the first corrector 530 may determine that there is no error in the data DATA'. In such a case, the input data DATA' and the output data DATA of the first corrector 530 may be substantially identical to each other. However, when '1' exists in the values S0 to S31 of the first syndrome SYNDROME_0 and the second syndrome SYNDROME_1, the first corrector 530 may perform an operation of finding a symbol having an error among the symbols Symbol 0 to Symbol 15 of the data DATA', and restoring a value of the symbol having an error.

Figure 8:
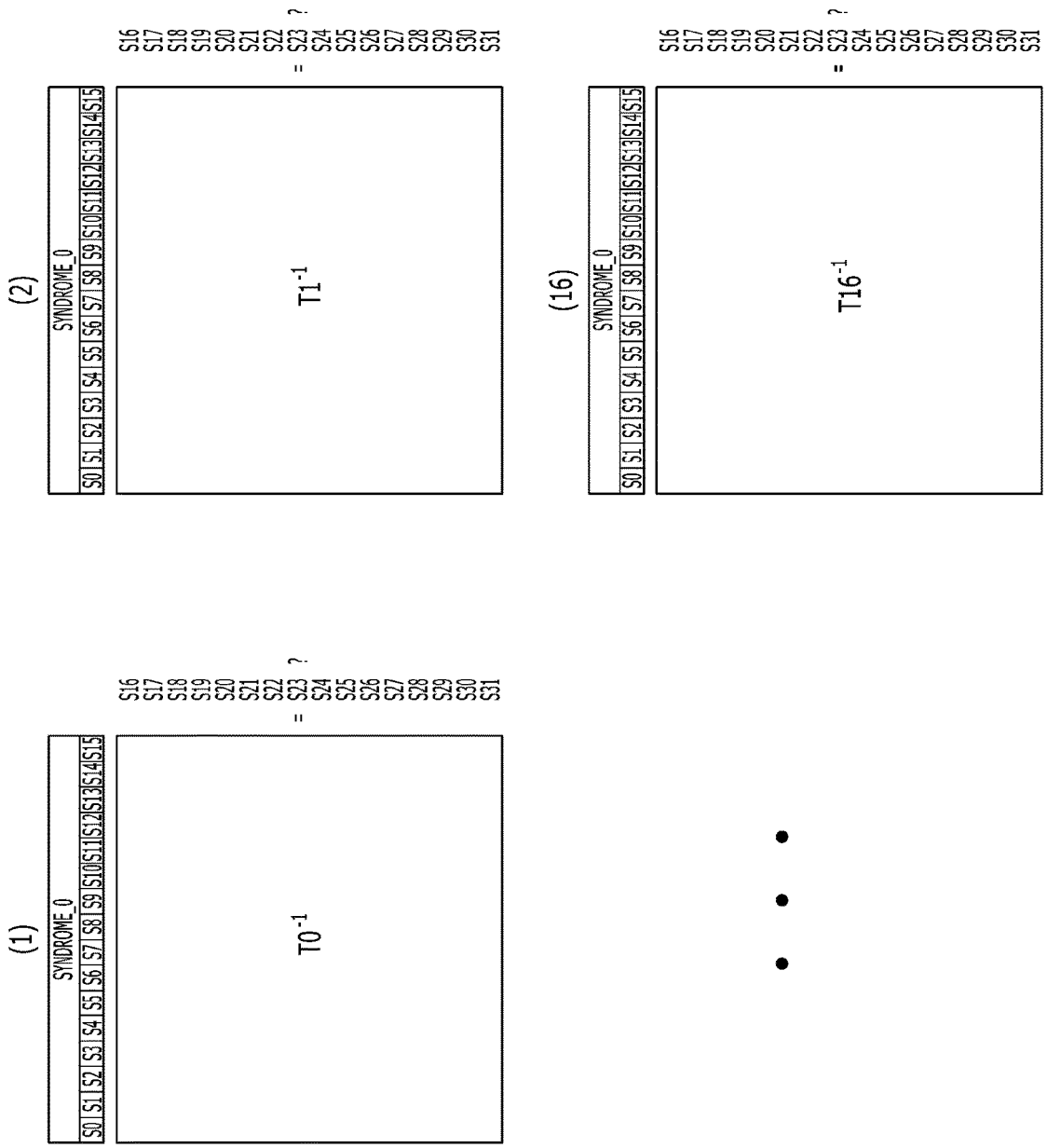
FIG. 8 is a diagram illustrating a process in which a first corrector 530 finds a symbol having an error among symbols Symbol 0 to Symbol 15 of data DATA' in accordance with an embodiment of the present disclosure.

FIG. 8 illustrates a process in which the first corrector 530 finds a symbol having an error among the symbols Symbol 0 to Symbol 15 of the data DATA' in accordance with an embodiment of the present disclosure. FIG. 8 (1) illustrates a process of checking whether there is an error in the symbol Symbol 0 of the data DATA', and FIG. 8 (2) illustrates a process of checking whether there is an error in the symbol Symbol 1 of the data DATA'. Similarly, FIG. 8 (16) illustrates a process of checking whether there is an error in the symbol Symbol 16 of the data DATA'. $T0^{-1}$ represents an inverse matrix of the 16×16 matrix T0 included in the first parity matrix (T0 to T16), $T1^{-1}$ represents an inverse matrix of the 16×16 matrix T1, and $T16^{-1}$ represents an inverse matrix of the 16×16 matrix T16.

Referring to FIG. 8 (1), the bits S0 to S15 of the first syndrome SYNDROME_0 may be multiplied by corresponding column vectors in the matrix $T0^{-1}$, and the multiplication results may be added in the horizontal direction. When the 16-bit value generated in this way is substantially identical to the 16 bits S16 to S31 of the second syndrome SYNDROME_1, it may be determined that an error exists in the symbol Symbol 0 of the data DATA'. Referring to FIG. 8 (2), the bits S0 to S15 of the first syndrome SYNDROME_0 may be multiplied by corresponding column vectors in the matrix $T1^{-1}$, and the multiplication results may be added in the horizontal direction. When the 16-bit value generated in this way is substantially identical to the 16 bits S16 to S31 of the second syndrome SYNDROME_1, it may be determined that an error exists in the symbol Symbol 1 of the data DATA'. Referring to FIG. 8 (16), the bits S0 to S15 of the first syndrome SYNDROME_0 may be multiplied by corresponding column vectors in the matrix $T16^{-1}$, and the multiplication results may be added in the horizontal direction. When the 16-bit value generated in this way is substantially identical to the 16 bits S16 to S31 of the second syndrome SYNDROME_1, it may be determined that an error exists in the symbol Symbol 16 of the data DATA'. Through such a process, the first corrector 530 may find out which symbol of the symbols Symbol 0 to Symbol 16 of the data DATA' has an error.

Referring back to FIG. 5, after the first corrector 530 finds out the positions of symbols having an error among the symbols Symbol 0 to Symbol 16 of the data DATA', the first corrector 530 may correct the error of the symbol having the error. The first corrector 530 may correct the error of the symbol having the error by adding the second syndrome SYNDROME_1 to the symbol having the error in the data DATA'. For example, when there is an error in the symbol Symbol 16 of the data DATA', the first corrector 530 may correct the error by adding the bits D256 to D271 of the symbol Symbol 16 and the bits S16 to S31 of the second syndrome SYNDROME_1. That is, Error Corrected D256 may be D256+S16, Error Corrected D257 may be D257+ S17, . . . , and Error Corrected D271 may be D271+S31.

The second corrector 540 may be activated in the second error correction mode in which the error correction mode signal ERR_MODE is deactivated, and may correct the error in the data DATA' by using the first syndrome SYNDROME_0. The second corrector 540 may have an error correction capability in units of bits. The second corrector 540 may be deactivated in the first error correction mode in which the error correction mode signal ERR_MODE is activated.

When the values S0 to S15 of the first syndrome SYNDROME_0 are all '0', the second corrector 540 may determine that there is no error in the data DATA'. In such a case, the input data DATA' and the output data DATA of the second corrector 540 may be identical to each other. When none the values S0 to S15 of the first syndrome SYNDROME_0 are '0', the second corrector 540 may correct the error in the data DATA' by inverting the bit of the data DATA' corresponding to a column vector having substantially the same value as the first syndrome SYNDROME_0 among the column vectors of the first parity matrix (T0 to T16). For example, when the values S0 to S15 of the first syndrome SYNDROME_0 are '0100010100010000', since the value of a column vector corresponding to the bit D14 of the data DATA' among the column vectors of the first parity matrix (T0 to T16) is '0100010100010000' (see FIG. 6), the second corrector 540 may correct the error in the data DATA' by inverting the bit D14 of the data DATA'. As another example, when the values S0 to S15 of the first syndrome SYNDROME_0 are '0000000010100011', the second corrector 540 may correct the error in the data DATA' by inverting the bit D31 of the data DATA' in which the value of the column vector is '0000000010100011' (see FIG. 6). In a case where none of the values S0 to S15 of the first syndrome SYNDROME_0 are '0', when there is no column vector substantially identical to the first syndrome SYNDROME_0 among the column vectors of the first parity matrix (T0 to T16), it may mean that the second corrector 540 is not able to correct an error due to the occurrence of the error in the data DATA', the error exceeding the error correction capability (for example, 1-bit error) of the second corrector 540.

Since the first syndrome SYNDROME_0 is used in common in the first error correction mode and the second error correction mode, the first syndrome generation circuit 510 may be utilized in the error correction operation of the first error correction mode and the error correction operation of the second error correction mode, and as a result, the area of the error correction circuit 120 may be reduced.

Figure 9:
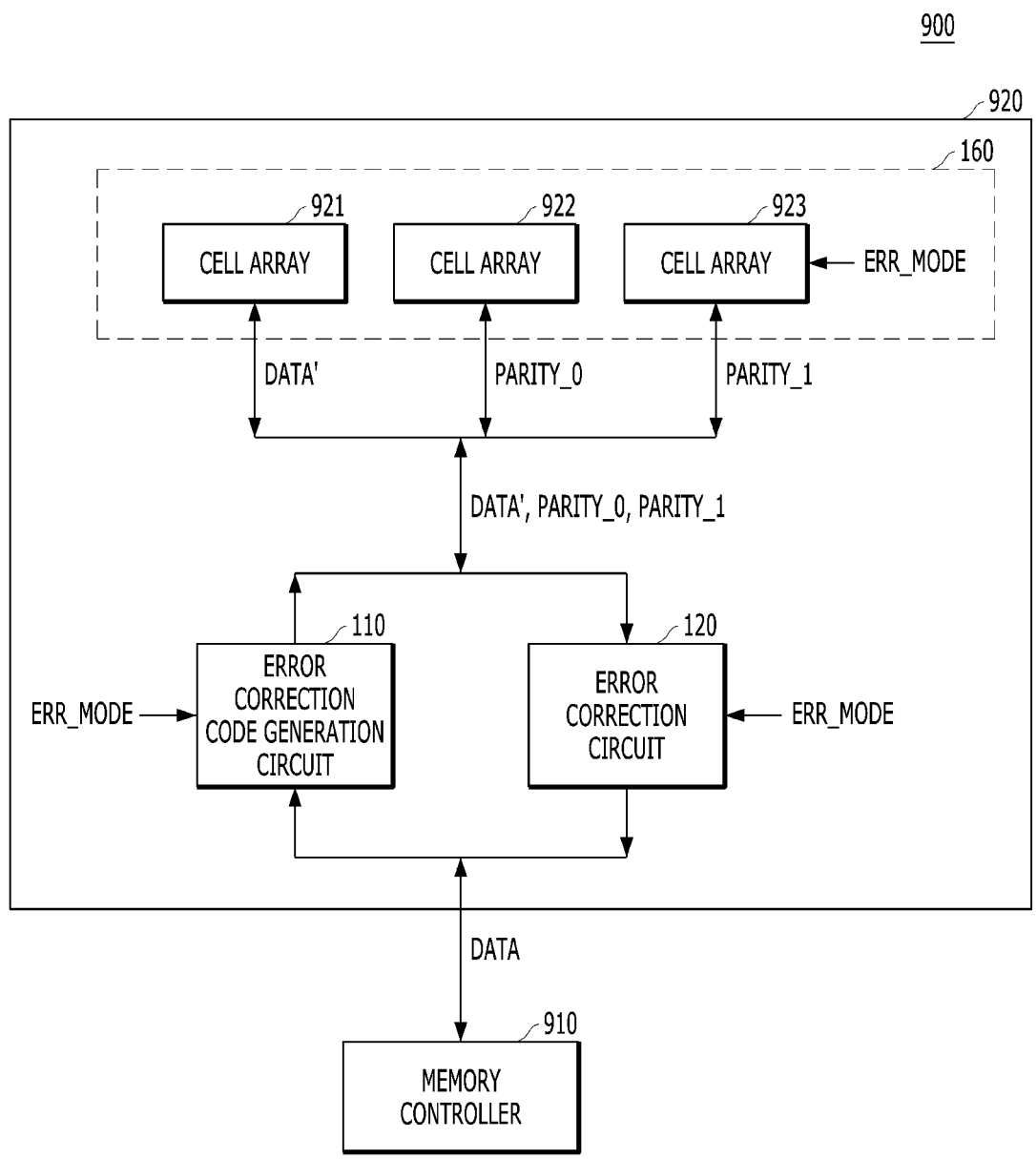
FIG. 9 is a configuration diagram of a memory system 900 in accordance with another embodiment of the present disclosure.

FIG. 9 is a configuration diagram of a memory system 900 in accordance with another embodiment of the present disclosure. An embodiment in which a memory 920 of the memory system 900 includes the error correction code generation circuit 110 and the error correction circuit 120 will be described with reference to FIG. 9. Referring to FIG. 9, the memory system 900 may include a memory controller 910 and the memory 920.

The memory controller 910 may control operations such as read and write of the memory 920 according to a request from a host. During the write operation, data may be transmitted from the memory controller 910 to the memory 920, and during the read operation, data DATA may be transmitted from the memory 920 to the memory controller 910.

The memory 920 may include the error correction code generation circuit 110, the error correction circuit 120, and the memory core 160.

The error correction code generation circuit 110 may generate an error correction code by using the data DATA during the write operation. The error correction code generation circuit 110 may generate the first error correction code ECC_L (=PARITY_0+PARITY_1) in the first error correction mode in which the error correction mode signal ERR_MODE is activated, and generate the second error correction code ECC_S (=PARITY_0) in the second error correction mode in which the error correction mode signal ERR_MODE is deactivated. Since the configuration and the operation of the error correction code generation circuit 110 have been described in detail with reference to FIG. 1 to FIG. 4, further detailed description thereof will be omitted.

The error correction circuit 120 may correct the error in the data DATA' by using the error correction code during the read operation. The error correction circuit 120 may correct the error in the data DATA' by using the first error correction code ECC_L (=PARITY_0+PARITY_1) in the first error correction mode in which the error correction mode signal ERR_MODE is activated, and correct the error in the data DATA' by using the second error correction code ECC_S (=PARITY_0) in the second error correction mode in which the error correction mode signal ERR_MODE is deactivated. Since the configuration and the operation of the error correction circuit 120 have been described in detail with reference to FIG. 1 and FIG. 5 to FIG. 8, further detailed description thereof will be omitted.

The memory core 160 may include cell arrays 921 to 923. The cell array 921 may represent a region for storing the data DATA' in the memory core 160, the cell array 922 may represent a region for storing the first parity PARITY_0 in the memory core 160, and the cell array 923 may represent a region for storing the second parity PARITY_1 in the memory core 160. The cell arrays 921 and 922 may be used in both the first error correction mode and the second error correction mode. However, in the second error correction mode, since the second parity PARITY_1 is not used, it is not necessary to write the second parity PARITY_1 to the cell array 923 and read the second parity PARITY_1 from the cell array 923. Therefore, in the second error correction mode in which the error correction mode signal ERR_MODE is deactivated, the cell array 923 may be deactivated, which makes it possible to reduce current consumption.

Figure 10:
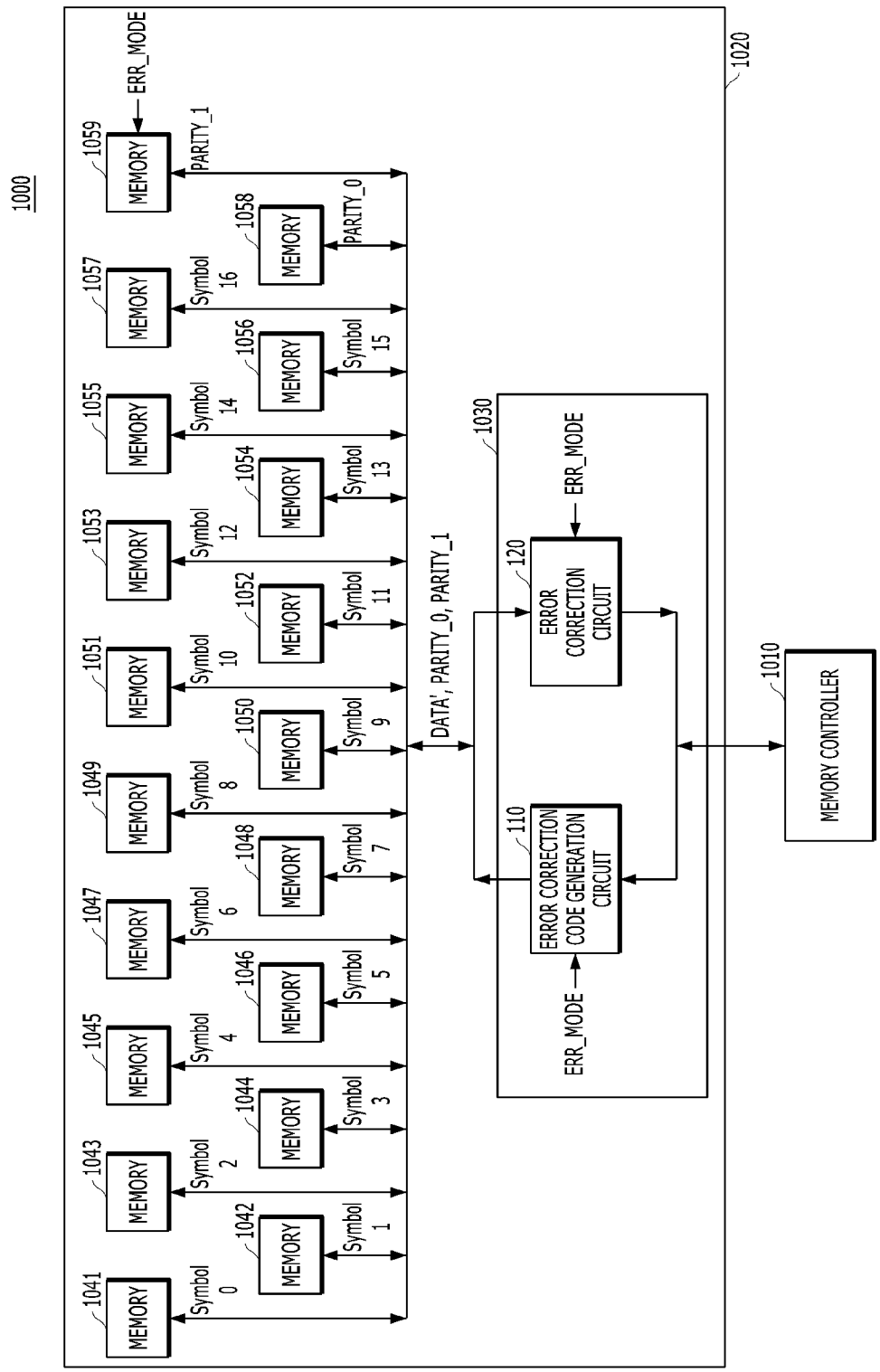
FIG. 10 is a configuration diagram of a memory system 1000 in accordance with further another embodiment of the present disclosure.

FIG. 10 is a configuration diagram of a memory system 1000 in accordance with further another embodiment of the present disclosure. An embodiment in which a module controller 1030 of a memory module 1020 of the memory system 1000 includes the error correction code generation circuit 110 and the error correction circuit 120 will be described with reference to FIG. 10.

Referring to FIG. 10, the memory system 1000 may include a memory controller 1010 and the memory module 1020.

The memory controller 1010 may control operations such as read and write of the memory module 1020 according to a request of a host. During the write operation, data may be transmitted from the memory controller 1010 to the memory module 1020, and during the read operation, data DATA may be transmitted from the memory module 1020 to the memory controller 1010.

The memory module 1020 may include the module controller 1030 and a plurality of memories 1041 to 1059. The memory module 1020 refers to a module including the plurality of memories 1041 to 1059, and examples of such a memory module 1020 may include a dual in-line memory module (DIMM), a solid-state drive (SSD), and the like.

The module controller 1030 may exist for an error correction operation of the memory module 1020, and may include the error correction code generation circuit 110 and the error correction circuit 120. The error correction code generation circuit 110 may generate an error correction code by using the data DATA during the write operation. The error correction code generation circuit 110 may generate the first error correction code ECC_L (=PARITY_0+PARITY_1) in the first error correction mode in which the error correction mode signal ERR_MODE is activated, and generate the second error correction code ECC_S (=PARITY_0) in the second error correction mode in which the error correction mode signal ERR_MODE is deactivated. The error correction circuit 120 may correct an error in data DATA' by using the error correction code during the read operation. The error correction circuit 120 may correct the error in the data DATA' by using the first error correction code ECC_L (=PARITY_0+PARITY_1) in the first error correction mode in which the error correction mode signal ERR_MODE is activated, and correct the error in the data DATA' by using the second error correction code ECC_S (=PARITY_0) in the second error correction mode in which the error correction mode signal ERR_MODE is deactivated. Since the configurations and the operations of the error correction code generation circuit 110 and the error correction circuit 120 have been described in detail with reference to FIG. 1 to FIG. 8, further detailed description thereof will be omitted.

The memories 1041 to 1059 may distribute and store the data DATA', and the parities PARITY_0 and PARITY_1. For each write operation, 272 bits of data DATA', 32 bits of parity PARITY_0, 32 bits of parity PARITY_1 may be stored in the memories 1041 to 1059 of the memory module 1020, and the 17 memories 1041 to 1059 may each store the data DATA' by 16 bits. That is, the 17 memories 1041 to 1057 may store the symbols Symbol 0 to Symbol 16 of the data DATA', respectively. The memory 1058 may store 16 bits of first parity PARITY_0 and the memory 1059 may store 16 bits of second parity PARITY_1. Since it is not necessary to use the second parity PARITY_1 in the second error correction mode, the memory 1059 may be deactivated in the second error correction mode in which the error correction mode signal ERR_MODE is deactivated, which makes it possible to reduce current consumption.

FIG. 10 illustrates that the number of the memories 1041 to 1059 of the memory module 1020 is 19, but it is natural that the number of memories may be different from this value. For example, 38 memories may be included in the memory module and each of the memories may store 8 bits of data or parity.

Figure 11:
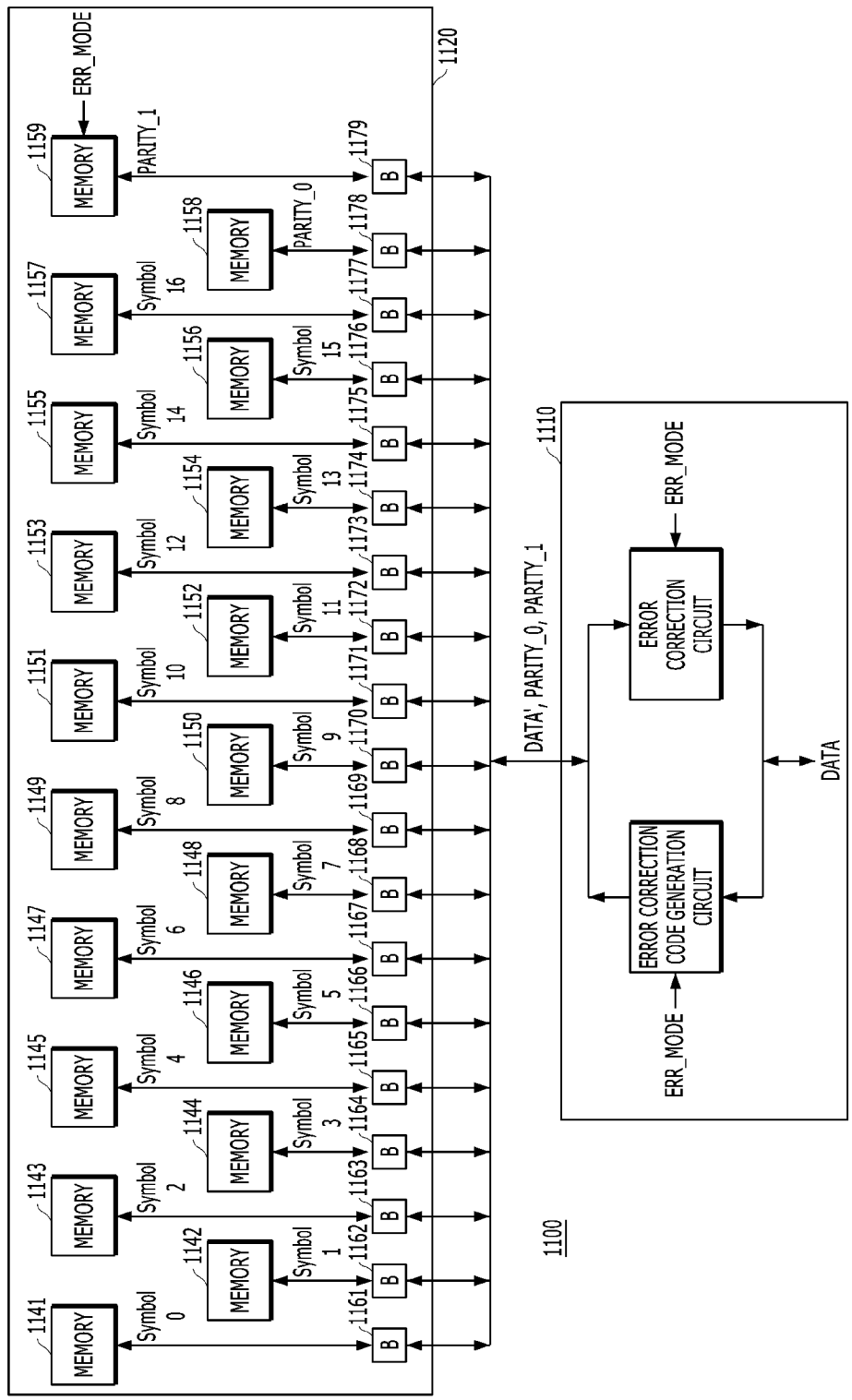
FIG. 11 is a configuration diagram of a memory system 1100 in accordance with still another embodiment of the present disclosure.

FIG. 11 is a configuration diagram of a memory system 1100 in accordance with still another embodiment of the present disclosure. An embodiment in which a memory controller 1110 of the memory system 1100 includes the error correction code generation circuit 110 and the error correction circuit 120 will be described with reference to FIG. 11.

Referring to FIG. 11, the memory system 1100 may include the memory controller 1110 and a memory module 1120.

The memory controller 1110 may control operations such as read and write of the memory module 1120 according to a request from a host. The memory controller 1110 may include the error correction code generation circuit 110 and the error correction circuit 120. The error correction code generation circuit 110 may generate an error correction code by using the data DATA during the write operation. The error correction code generation circuit 110 may generate the first error correction code ECC_L (=PARITY_0+PARITY_1) in the first error correction mode in which the error correction mode signal ERR_MODE is activated, and generate the second error correction code ECC_S (=PARITY_0) in the second error correction mode in which the error correction mode signal ERR_MODE is deactivated. The error correction circuit 120 may correct an error in data DATA' by using the error correction code during the read operation. The error correction circuit 120 may correct the error in the data DATA' by using the first error correction code ECC_L (=PARITY_0+PARITY_1) in the first error correction mode in which the error correction mode signal ERR_MODE is activated, and correct the error in the data DATA' by using the second error correction code ECC_S (=PARITY_0) in the second error correction mode in which the error correction mode signal ERR_MODE is deactivated. Since the configurations and the operations of the error correction code generation circuit 110 and the error correction circuit 120 have been described in detail with reference to FIG. 1 to FIG. 8, further detailed description thereof will be omitted.

The memory module 1120 may include a plurality of memories 1141 to 1159 and buffers 1160 to 1179. The memory module 1120 means a module including the plurality of memories 1141 to 1159, and examples of such a memory module 1120 may include a dual in-line memory module (DIMM), a solid-state drive (SSD), and the like.

The memories 1141 to 1159 may distributed and store the data DATA' and the parities PARITY_0 and PARITY_1. For each write operation, 272 bits of data DATA', 32 bits of parity PARITY_0, and 32 bits of parity PARITY_1 may be stored in the memories 1141 to 1159 of the memory module 1120, and the 17 memories 1141 to 1159 may each store the data DATA' by 16 bits. That is, the 17 memories 1141 to 1157 may store the symbols Symbol 0 to Symbol 16 of the data DATA', respectively. The memory 1158 may store 16 bits of first parity PARITY_0 and the memory 1159 may store 16 bits of second parity PARITY_1. Since it is not necessary to use the second parity PARITY_1 in the second error correction mode, the memory 1159 may be deactivated in the second error correction mode in which the error correction mode signal ERR_MODE is deactivated, which makes it possible to reduce current consumption.

The buffers 1160 to 1179 may be used to buffer the data DATA' and the parities PARITY_0 and PARITY_1 transmitted and received between the memory controller 1110 and the memories 1141 to 1159. In the second error correction mode in which the memory 1159 is not used, since it is not necessary to use the buffer 1179, the buffer 1179 may be deactivated in the second error correction mode in which the error correction mode signal ERR_MODE is deactivated, which makes it possible to reduce current consumption. According to an embodiment, the memory controller 1110 and the memories 1141 to 1159 may directly transmit/receive the data DATA' and the parities PARITY_0 and PARITY_1 to/from each other without the buffers 1161 to 1179.

FIG. 11 illustrates that the number of memories 1141 to 1159 is 19 and the number of buffers 1161 to 1179 is 19, but it is natural that the number of memories 1141 to 1159 and the number of buffers 1161 to 1179 may be different from these values.

In the memory systems 100, 900, 1000, and 1100, switching between the first error correction mode and the second error correction mode may be performed in real time. After the data DATA is written in the first error correction mode, the error correction operation may be normally performed even though the error correction mode is changed to the second error correction mode. In such a case, a region for storing the second parity PARITY_1 in the memory systems 100, 900, 1000, and 1100 may be deactivated according to a mode change from the first error correction mode to the second error correction mode.

However, when the error correction mode is changed to the first error correction mode after the data DATA is written in the second error correction mode, the second parity PARITY_1 generated during the write operation does not exist. Therefore, the error correction operation in the first error correction mode may not be performed.

Although the technical spirit of the present disclosure has been specifically described according to the above embodiments, it should be noted that the above embodiments are for description, not for its limitation. Furthermore, those who skilled in the art will understand that various embodiments can be made within the scope of the technical spirit of the present disclosure and the following claims. Furthermore, the embodiments may be combined to form additional embodiments.

What is claimed is:

1. A memory system comprising:
an error correction code generation circuit configured to generate a first error correction code having a first parity and a second parity by using write data and a first H matrix having a first parity matrix for generating the first parity and a second parity matrix for generating the second parity in a first error correction mode, and to generate a second error correction code having the first parity by using the write data and a second H matrix having the first parity matrix in a second error correction mode; and
a memory core configured to store the first error correction code and the write data in the first error correction mode, and to store the second error correction code and the write data in the second error correction mode.

2. The memory system of claim 1, wherein the first H matrix includes the second H matrix.

3. The memory system of claim 2, further comprising an error correction circuit configured to:
perform, in the first error correction mode, an error correction operation in units of symbols on data read from the memory core by using the first error correction code read from the memory core; and
perform, in the second error correction mode, an error correction operation in units of bits on the data read from the memory core by using the second error correction code read from the memory core.

4. The memory system of claim 1,
wherein the error correction code generation circuit comprises:
a first parity generation circuit configured to generate the first parity by using the first parity matrix; and
a second parity generation circuit configured to generate the second parity by using the second parity matrix,
wherein, in the first error correction mode, the first parity generation circuit and the second parity generation circuit are activated, and
wherein, in the second error correction mode, the first parity generation circuit is activated and the second parity generation circuit is deactivated.

5. The memory system of claim 1, wherein the memory core comprises:
a first region configured to store the write data;
a second region configured to store the first parity; and
a third region configured to store the second parity, and
wherein the third region is activated in the first error correction mode and is deactivated in the second error correction mode.

6. The memory system of claim 1, further comprising an error correction circuit configured to perform an error correction operation,
wherein the error correction circuit comprises:
a first syndrome generation circuit configured to generate, in the respective first and second error correction modes, a first syndrome by using the data read from the memory core and the first parity corresponding to the read data;
a second syndrome generation circuit configured to generate, in the first error correction mode, a second syndrome by using the read data and the second parity corresponding to the read data;
a first corrector configured to correct, in the first error correction mode, an error in the read data by using the first syndrome and the second syndrome; and
a second corrector configured to correct, in the second error correction mode, the error in the read data by using the first syndrome.

7. The memory system of claim 6, wherein the first corrector has a higher error correction capability than the second corrector.

8. A memory system comprising: an error correction code generation circuit configured to generate a first error correction code having a first parity and a second parity by using write data and a first H matrix having a first parity matrix for generating the first parity and a second parity matrix for generating the second parity in a first error correction mode, and to generate a second error correction code having the first parity by using the write data and a second H matrix having the first parity matrix in a second error correction mode; and
a memory core configured to store the first error correction code and the write data in the first error correction mode, and to store the second error correction code and the write data in the second error correction mode,
wherein the first error correction code includes a Reed-Solomon (RS) code, and the second error correction code includes a single error correction double error detection (SECDED) code.

* * * * *